United States Patent
Koseko

[19]
[11] Patent Number: 6,163,760
[45] Date of Patent: Dec. 19, 2000

[54] METHOD OF PRODUCING A TEST PATTERN ALLOWING DETERMINATION OF ACCEPTANCE AND REJECTION OF A SEMICONDUCTOR DEVICE WITHOUT CAUSING A TIMING PROBLEM

[75] Inventor: Yasushi Koseko, Hyogo, Japan

[73] Assignee: Mitsubishi Denki Kabushiki Kaisha, Tokyo, Japan

[21] Appl. No.: 09/058,415

[22] Filed: Apr. 10, 1998

[30] Foreign Application Priority Data

Oct. 31, 1997 [JP] Japan ................................ 9-300376

[51] Int. Cl.⁷ ............................................. G01R 31/3183
[52] U.S. Cl. .................... 702/124; 702/125; 702/117; 714/738
[58] Field of Search .......................... 371/22.31, 22.32, 371/22.33, 22.34, 22.35, 22.36, 27.1, 27.2, 27.3, 27.4, 27.5, 27.6, 27.7; 702/124, 125, FOR 103, FOR 104, FOR 170, FOR 171, 126, 108, 79, 117–123, 57–59, 69, 176, 189, 183–185; 395/183.04, 183.06, 500.05–500.07, 500.35–500.38, 500.4, 500.41; 324/765, 158.1, 73.1, 527, 528, 512, 522, 523; 714/738, 739, 741, 742, 743, 744, 25, 28, 30, 36, 41, 726, 728, 729, 731; 703/19; 716/4–6

[56] References Cited

U.S. PATENT DOCUMENTS

| | | |
|---|---|---|
| 5,600,787 | 2/1997 | Underwood et al. ............... 396/183.06 |
| 5,650,938 | 7/1997 | Bootehsaz et al. ...................... 364/490 |
| 5,650,947 | 7/1997 | Okumura ................................. 364/578 |

FOREIGN PATENT DOCUMENTS 60-135776  7/1985  Japan .

OTHER PUBLICATIONS

Comer, David J. "Digital Logic and State Machine Design," (New York: CBS College Publishing, 1984), Chapter 1, p. 26, Dec. 1984.

*Primary Examiner*—Hal Wachsman
*Attorney, Agent, or Firm*—McDermott, Will & Emery

[57] ABSTRACT

A method and program for producing a test pattern of a semiconductor device includes using a result of timing verification of the semiconductor device to select an unverified path in the semiconductor device. A signal line on the unverified path is selected and a dummy element that always outputs an inconstant value is virtually inserted into the signal line. The test pattern for the semiconductor device with the virtually inserted dummy element is then produced.

14 Claims, 8 Drawing Sheets

METHOD OF PRODUCING A TEST PATTERN ALLOWING DETERMINATION OF ACCEPTANCE AND REJECTION OF A SEMICONDUCTOR DEVICE WITHOUT CAUSING A TIMING PROBLEM

BACKGROUND OF THE INVENTION

1. Field of the Invention

The present invention relates to a method of producing a test pattern of a semiconductor device as well as a computer-readable record medium bearing a program of producing the test pattern of the semiconductor device, and in particular relates to a method of producing a test pattern of a semiconductor device which allows determination of acceptance and rejection of a semiconductor device without causing a timing problem as well as a computer-readable record medium bearing a program of producing a test pattern of a semiconductor device.

2. Description of the Background Art

If timing verification of a semiconductor device is performed with a static timing verifying tool allowing inclusive timing verification, timing for a false path which is not used during system operation is also verified so that an unnecessary timing offense is detected in some cases. In the prior art, therefore, such manners are frequently employed that the false pass is excluded, in advance, from a target of timing verification, or a timing offense is ignored, in advance. Then, a test pattern is produced with a test pattern producing tool.

However, the foregoing test pattern producing tool cannot recognize a false path, so that a test pattern using the false path, i.e., a test pattern having a possibility of causing a timing problem is produced. When a test of a semiconductor device is conducted with such a test pattern, acceptance and rejection may be erroneously determined.

SUMMARY OF THE INVENTION

The invention has been developed for overcoming the foregoing problem, and it is an object of the invention to provide a method of producing a test pattern of a semiconductor device enabling a reliable test.

Another object of the invention is to provide a computer-readable record medium which bears a test pattern producing program for a semiconductor device enabling a reliable test without causing a timing problem.

According to an aspect of the invention, a test pattern producing method for a semiconductor device includes a step of receiving a result of timing verification of a semiconductor device, and selecting an unverified path in the semiconductor device based on the result of the timing verification; a signal line select step of selecting a signal line on the unverified path; a dummy element inserting step of virtually inserting into the signal line a dummy element always outputting an inconstant value; and a step of producing a test pattern of the semiconductor device containing the dummy element virtually inserted thereinto.

The test pattern of the semiconductor device is produced after virtually inserting the dummy element always outputting the inconstant value into the signal line on the unverified path. By conducting the test with this test pattern, therefore, the test can be reliably conducted without a timing problem even if the test pattern contains an unverified path such as a false path.

Preferably, the signal line select step includes an isolated signal line select step of selecting from the signal lines on the unverified path a signal line not located upstream to a divided signal line and not located downstream from a coupled signal line.

The signal line not belonging to any path is found from the signal lines on the unverified path. Therefore, it is possible to minimize an influence which may be exerted on another path by virtual insertion of the dummy element into the unverified path, so that lowering in failure detection rate can be suppressed.

Preferably, the signal line select step includes a minimum influence signal line select step of selecting from the signal lines on the unverified path a signal line exerting a minimum influence on the signal line on the path other than the unverified path during operation of the semiconductor device after the virtual insertion of the dummy element.

The signal line exerting the minimum influence on another path is selected from the signal lines on the unverified path. Therefore, it is possible to minimize an influence on another path by the virtual insertion of the dummy element into the unverified path, so that lowering in failure detection rate can be suppressed.

According to yet another aspect, the invention provides a computer-readable record medium bearing a program of producing a test pattern of a semiconductor device for executing a test pattern producing method for the semiconductor device with a computer, the test pattern producing method including a step of receiving a result of timing verification of the semiconductor device, and selecting an unverified path in the semiconductor device based on the result of the timing verification; a signal line select step of selecting a signal line on the unverified path; a dummy element inserting step of virtually inserting into the signal line a dummy element always outputting an inconstant value; and a step of producing the test pattern of the semiconductor device containing the dummy element virtually inserted thereinto.

The test pattern of the semiconductor device is produced after virtually inserting the dummy element always outputting the inconstant value into the signal line on the unverified path. By conducting the test with this test pattern, therefore, the test can be reliably conducted without a timing problem even if the test pattern contains an unverified path such as a false path.

Preferably, the signal line select step includes an isolated signal line select step of selecting from the signal lines on the unverified path a signal line not located upstream to a divided signal line and not located downstream from a coupled signal line.

The signal line not belonging to any path is found from the signal lines on the unverified path. Therefore, it is possible to minimize an influence which may be exerted on another path by virtual insertion of the dummy element into the unverified path, so that lowering in failure detection rate can be suppressed.

Preferably, the signal line select step includes a minimum influence signal line select step of selecting from the signal lines on the unverified path a signal line exerting a minimum influence on the signal line on the path other than the unverified path during operation of the semiconductor device after the virtual insertion of the dummy element.

The signal line exerting the minimum influence on another path is selected from the signal lines on the unverified path. Therefore, it is possible to minimize an influence on another path by the virtual insertion of the dummy element into the unverified path, so that lowering in failure detection rate can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

A test pattern producing device for a semiconductor device according to an embodiment 1 of the invention will now be described below with reference to drawings. In the following description and figures, the same parts and portions bear the same reference numbers or characters. These members and parts have the same names and functions so that description of them may not be repeated.

Figure 1:
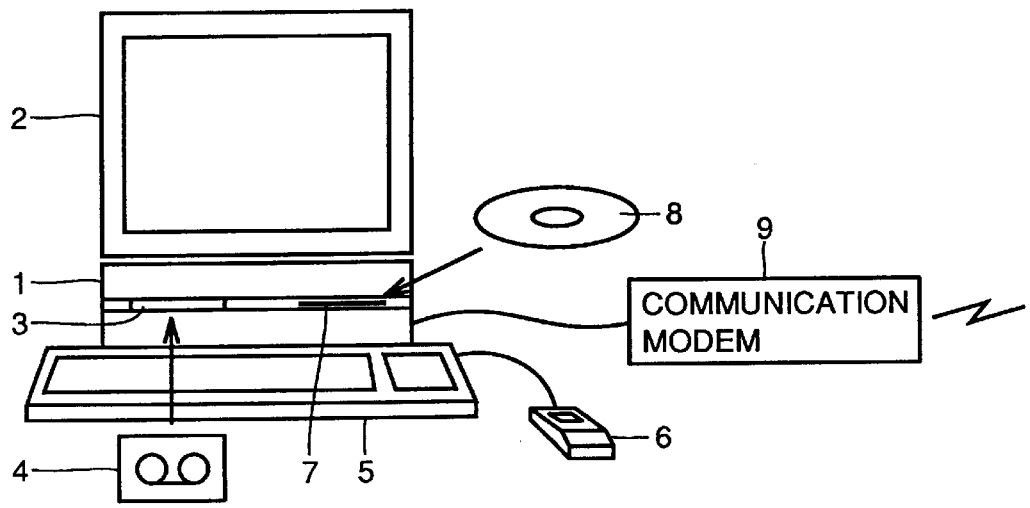
FIG. 1 shows an external appearance of a test pattern producing device for a semiconductor device according to an embodiment 1 of the invention.

Referring to FIG. 1, the test pattern producing device includes a computer 1, a keyboard 5 and a mouse 6 for entering instructions into computer 1, a display 2 for displaying information such as a result of an operation of computer 1, a magnetic tape device 3, a CD-ROM (Compact Disc-Read Only Memory) device 7 and a communication modem 9 for reading a program to be executed by computer 1.

A program for producing a test pattern is recorded on magnetic tape 4 or CD-ROM 8 which is a computer-readable record medium and can be read by magnetic tape device 3 or CD-ROM device 7. The program can also be read by modem 9 through a communication line.

Figure 2:
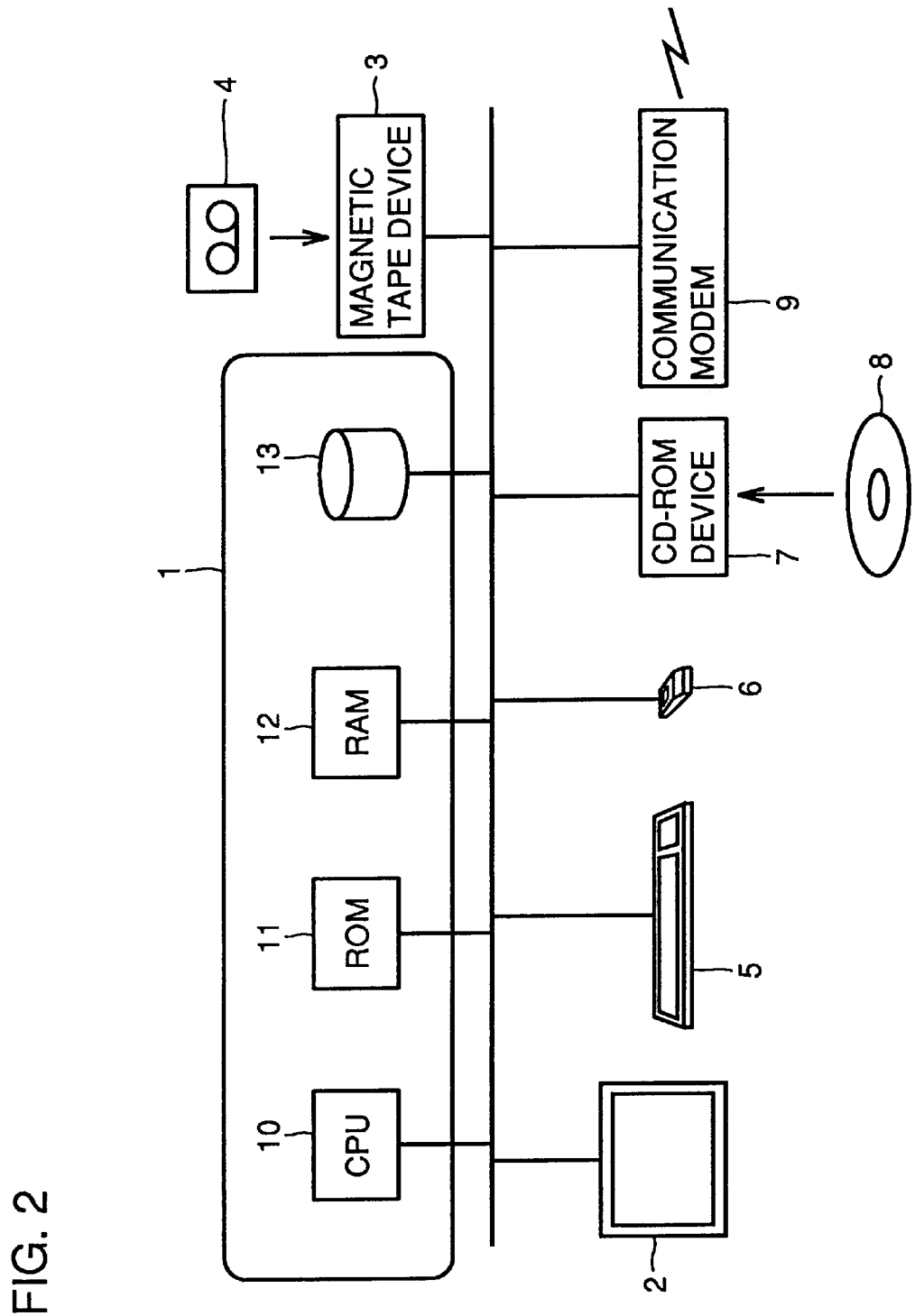
FIG. 2 is a block diagram of the test pattern producing device for the semiconductor device according to the embodiment 1 of the invention.

Referring to FIG. 2, computer 1 includes a CPU (Central Processing Unit) 10 for executing the program which is read through magnetic tape device 3, CD-ROM device 7 or communication modem 9, a ROM (Read Only Memory) 11 storing programs and data required for the operation of computer 1, a RAM (Random Access Memory) 12 storing data such as parameters during execution of the program, and a magnetic disk 13 storing the program and data.

A method which will be described below is achieved by the program which is executed by computer 1.

Figure 3A:
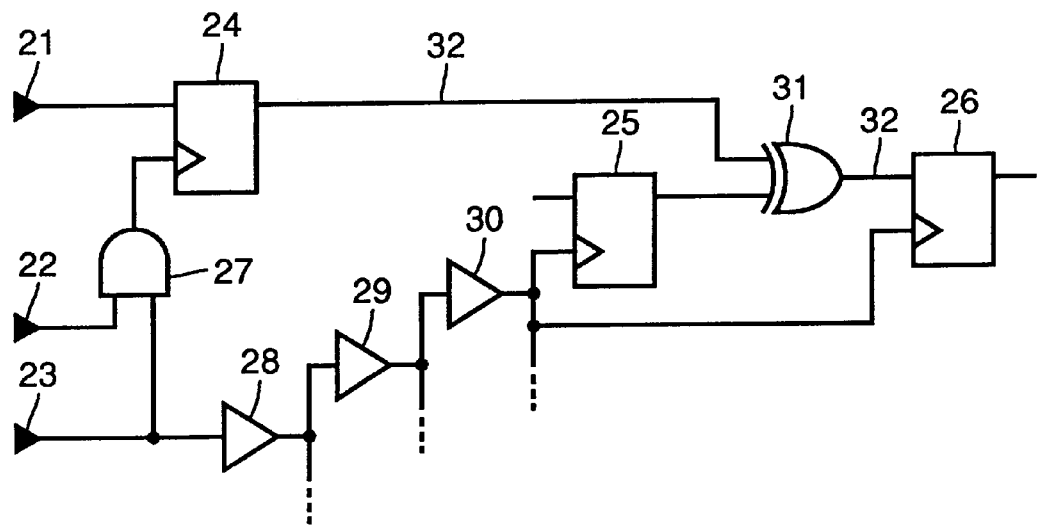
FIGS. 3A and 3B are logic circuit diagrams of the semiconductor device according to the embodiment 1 of the invention.

Referring to FIG. 3A, a logic circuit of a semiconductor device containing a false path includes an initial value setting terminal 21, a control terminal 22 of initial value setting, a clock terminal 23, an AND element 27 for a clock gate connected to control terminal 22 for initial value setting and clock terminal 23, a flip-flop 24 which receives the output of clock gate AND element 27 and operates in responsive to the output of clock gate AND element 27 to hold and output the output of initial value setting terminal 21, clock tree buffers 28–30 connected to clock terminal 23 for distributing the clock signal to flip-flops of the logic circuit, a flip-flop 25 which is connected to the output of clock tree buffer 30 and is responsive to the output of clock tree buffer 30 to hold and output the output sent from another logic circuit in the semiconductor device, an exclusive OR element 31 receiving the outputs of flip-flops 24 and 25, and a flip-flop 26 which is connected to the outputs of exclusive OR element 31 and clock tree buffer 30, and is responsive to the output of clock tree buffer 30 to hold and output the output of exclusive OR element 31.

In an operation of the system, an initial value is first set in flip-flop 24. For this, a logical value 1 is given to initial value setting control terminal 22, the initial value is given to initial value setting terminal 21, and a clock is applied to clock terminal 23. Then, initial value setting control terminal 22 is fixed at a logical value of 0, and the system operation will start after a sufficient time. Thus, flip-flop 24 is used as a flip-flop dedicated to setting of the initial value. In this case, a timing problem does not arise during the system operation even if a timing offense occurs on a path between flip-flops 25 and 26. The output signal line of flip-flop 24 and the output signal line of exclusive OR element 31 form false paths 32, respectively.

Since a test pattern producing tool cannot recognize the false path, a test pattern having a defect in timing may be produced if the test pattern is produced using the logic circuit as it was. Accordingly, a test pattern having no defect in timing is produced in accordance with the following procedure.

Figure 4:
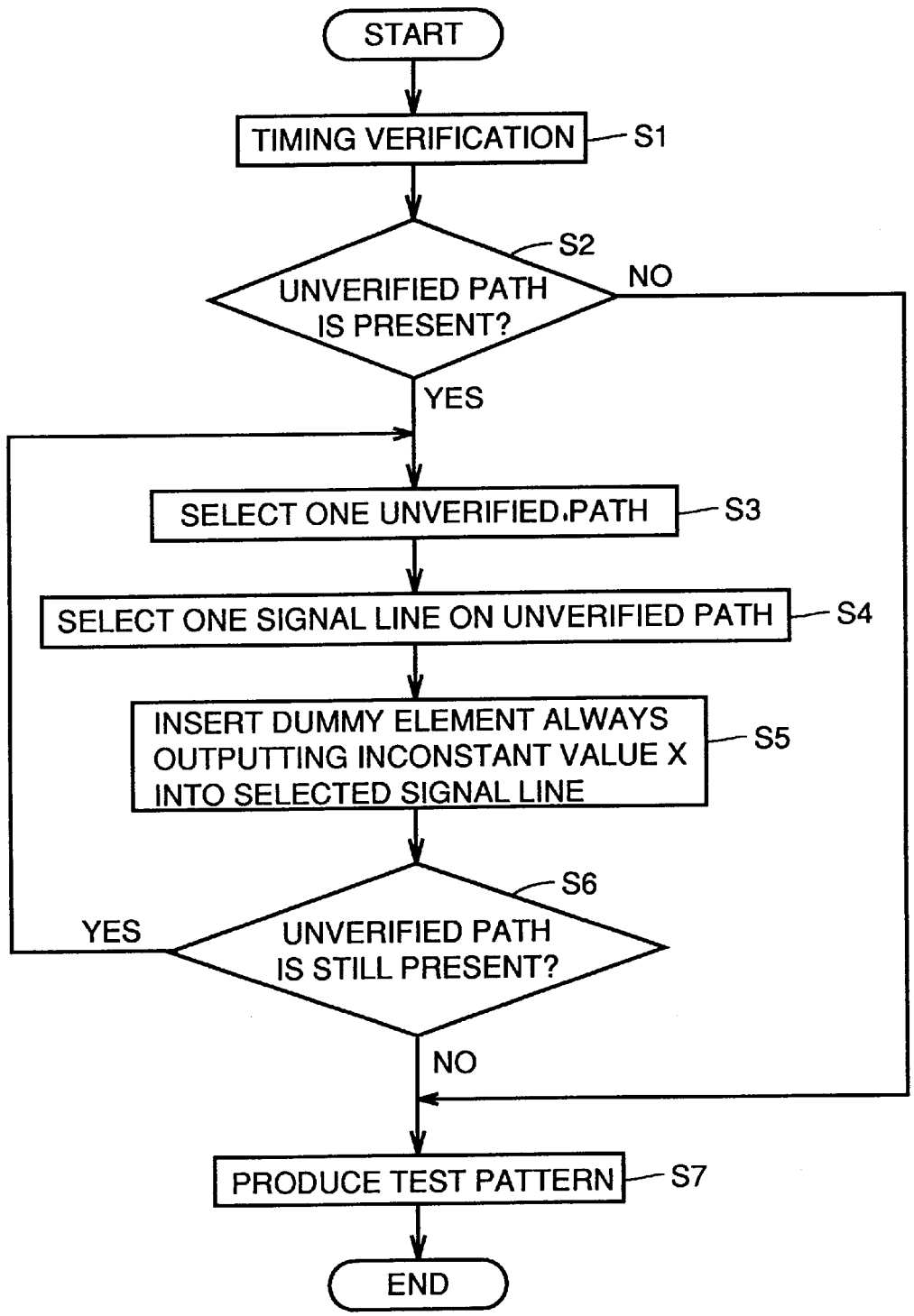
FIG. 4 is a flowchart showing a flow of processing of the test pattern producing device for the semiconductor device according to the embodiment 1 of the invention.

Referring to FIG. 4, a processing procedure of the test pattern producing device will be described below. Prior to production of the test pattern, timing verification is performed on logic circuits in the semiconductor device (S1). By the timing verification, unverified paths such as a false path, which contain timing offenses but are not used in the system operation, are extracted. Based on the result of timing verification, it is then determined whether an unverified path is present in the logic circuit or not (S2). If the unverified path is not present (NO at S2), the test pattern is produced based on the logic circuit (S7).

Figure 3B:
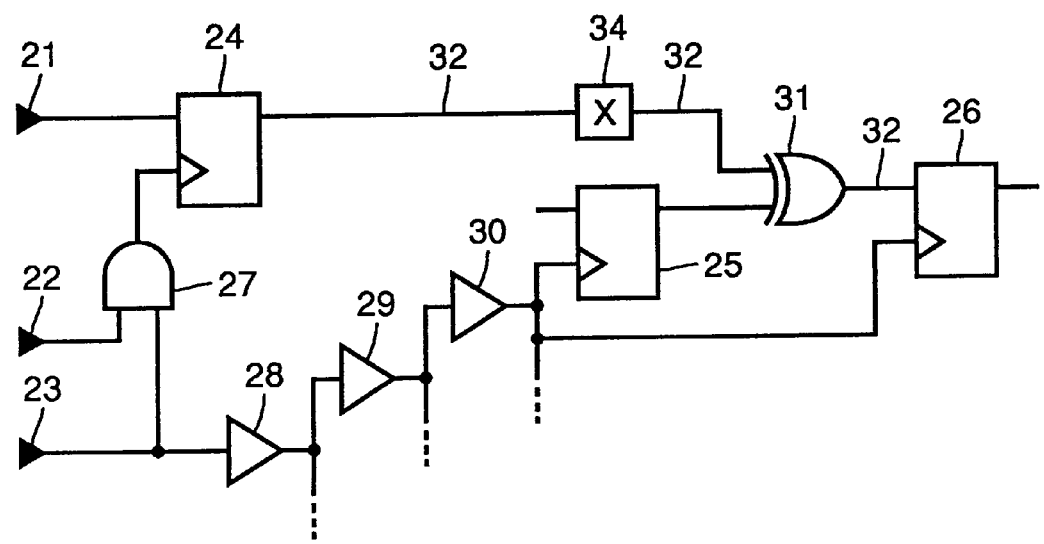

If the unverified path is present (false path 32, YES at S2), one path (false path 32) is arbitrarily selected from the unverified paths (S3). One signal line on the selected unverified path (false path 32) is selected (e.g., false path 32, S4). Referring to FIG. 3B, a dummy element 34 which always outputs an inconstant value X is virtually inserted into the selected signal line (false path 32, S5). It is determined whether the logic circuit contains an unverified path into which dummy element 34 is not yet virtually inserted (S6). If there is the unverified path not containing dummy element 34 inserted thereinto (YES at S6), processing at and after S3 is repeated. If there is no unverified path not containing dummy element 34 inserted thereinto (NO at S6), it is determined that the insertion of dummy element 34 is completed, and the test pattern is produced (S7).

As described above, if an unverified path is present in the logic circuit, the test pattern is produced after virtually inserting the dummy element onto the unverified path. Thereby, it is possible to produce the test pattern causing no problem in timing.

This embodiment has been discussed, by way of example, in connection with the logic circuit containing the unverified path such as a false path, a similar effect can be achieved even in connection with a logic circuit which contains a path committing a timing offense. In the case of a scan design circuit, a similar timing offense may occur during a scan test, so that a similar effect can be achieved.

[Embodiment 2]

A device for producing a test pattern of a semiconductor device according to an embodiment 2 of the invention has a structure similar to that of the test pattern producing device according to the embodiment 1 already described with reference to FIGS. 1 and 2.

Figure 5A:
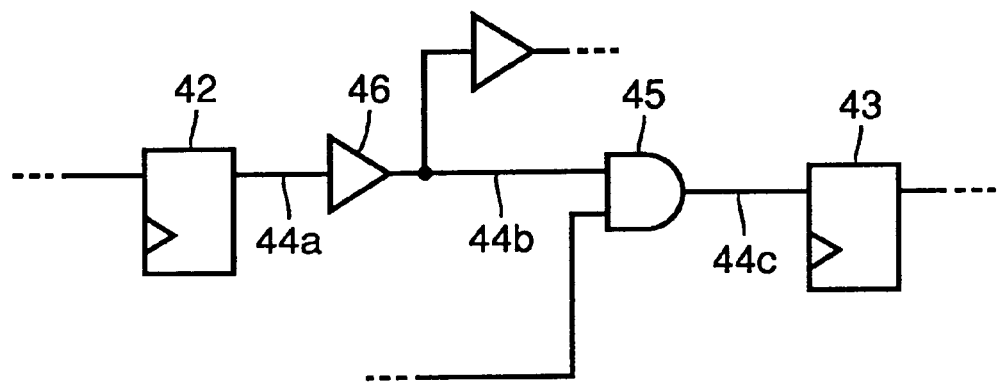
FIGS. 5A and 5B are logic circuit diagrams of a semiconductor device according to an embodiment 2 of the invention.

Referring to FIG. 5A, a logic circuit of a semiconductor device including an unverified path includes, for example, a flip-flop 42, a buffer 46 which is connected to the output of flip-flop 42 and receives the output of flip-flop 42, an AND element 45 receiving the output of buffer 46 and a signal sent from another logic circuit, and a flip-flop 43 connected to the output of AND element 45 for holding and outputting the output value thereof.

It is assumed that a signal line 44a between flip-flop 42 and buffer 46, a signal line 44b between buffer 46 and AND element 45, and a signal line 44c between AND element 45 and flip-flop 43 are signal lines on an unverified path.

The processing procedure of the test pattern producing device is similar to the processing procedure of the test pattern producing device according to the embodiment 1 already described with reference to FIG. 4. A difference between them is that processing at S11 through S13, which will be described later with reference to FIG. 6, is employed instead of the process (S4) of selecting one signal line on the unverified path for virtual insertion of the dummy element.

Figure 6:
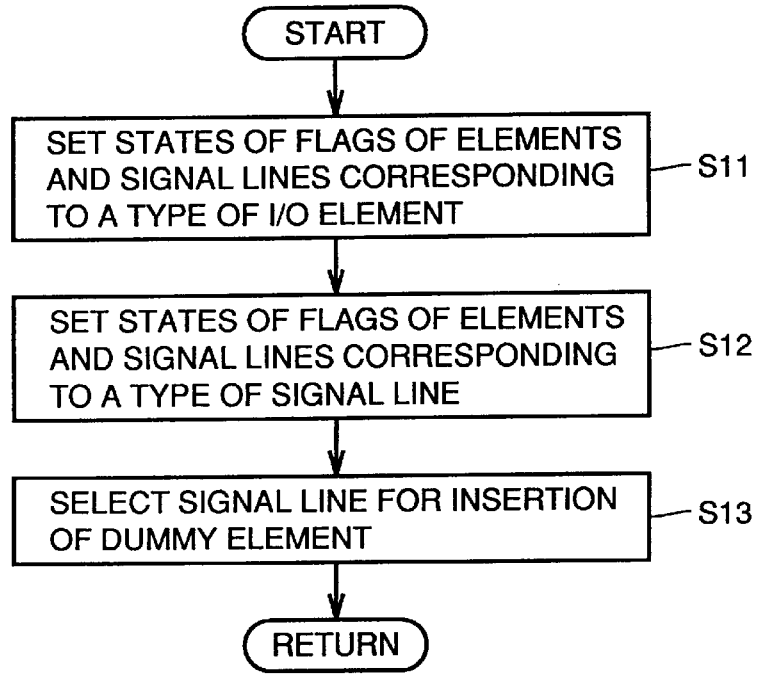
FIG. 6 is a flowchart showing a flow of processing of the test pattern producing device for the semiconductor device according to the embodiment 2 of the invention.

Referring to FIG. 6, the process (S4) of selecting one signal line on the unverified path into which the dummy element is to be inserted virtually is performed as follows. For each of elements in the logic circuit in the semiconductor device, a state of a flag provided for each of the elements and signal lines in the logic circuit is set depending on whether the element is a multi-input element or a multi-output element (S11). For each signal line in the logic circuit, the state of the flag of each of the elements and signal lines in the logic circuit is set depending on whether the signal line is a wired signal line or a fan-out signal line. The state of flag of each of elements and signal lines in the logic circuit is set (S12). The wired signal line is a signal line formed of a plurality of signal lines connected together. The fan-out signal line is a signal line diverging into a plurality of signal lines. Based on the states of flags set at S11 and S12, the signal line into which a dummy element is to be inserted in selected (S13).

Figure 7:
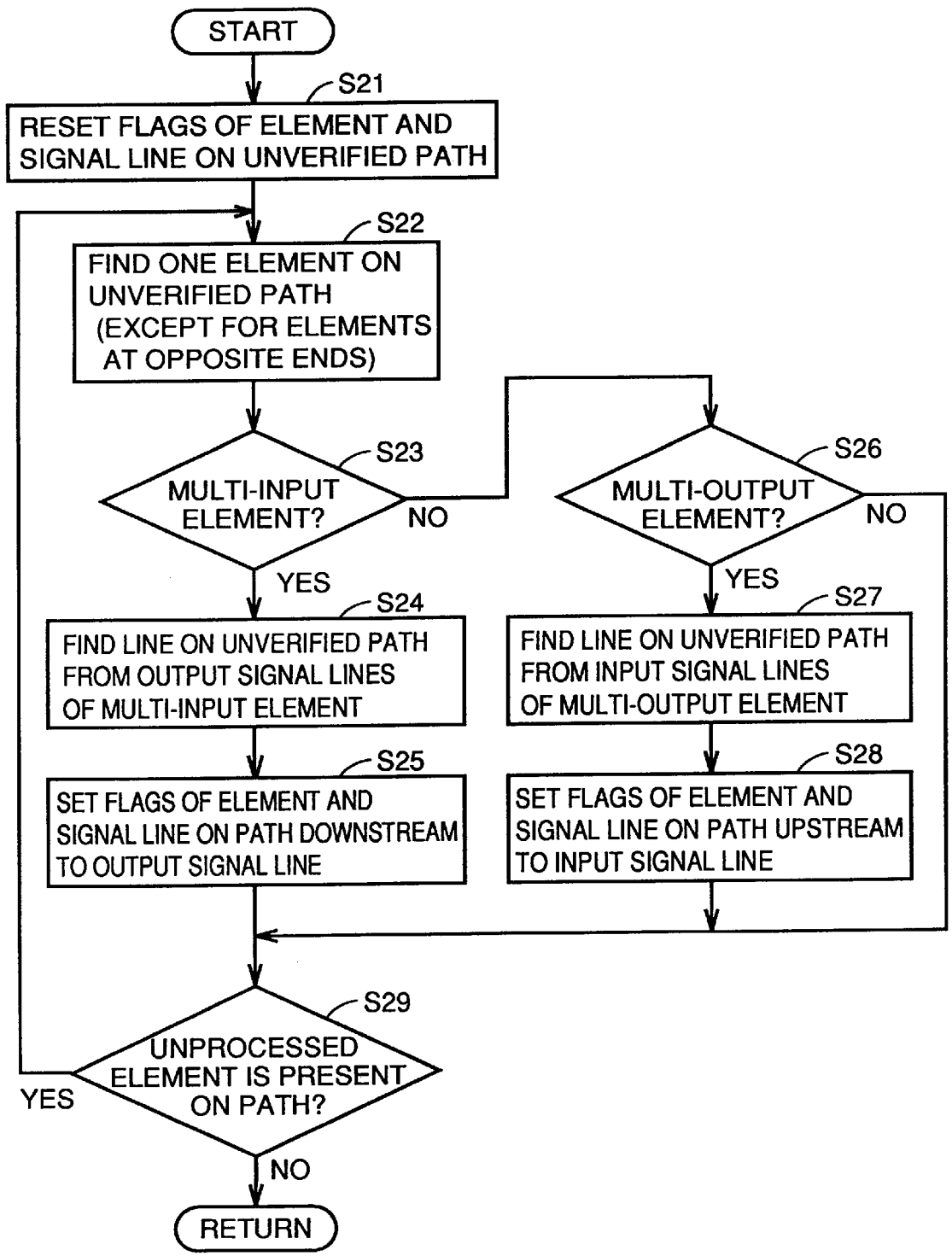
FIG. 7 is a flowchart showing processing of setting flag states of an element and a signal line in accordance with a type of an element.

Referring to FIG. 7, the processing at S11 will be described below more in detail. Flags of the elements and signal lines on the unverified path are reset (S21). One of these elements except for the elements (flip-flops 42 and 43) at the opposite ends of the unverified path is selected (S22). It is determined whether the selected element is a multi-input element or not (S23). If it is the multi-input element (e.g., AND element 45, YES at S23), a signal line (signal line 44c) present on the unverified path is found from the output signal lines of the multi-input element (AND element 45, S24). Flags of the element (flip-flop 43) and signal line (signal line 44c) which are present downstream to the output signal thus found are set (S25).

Figure 8:
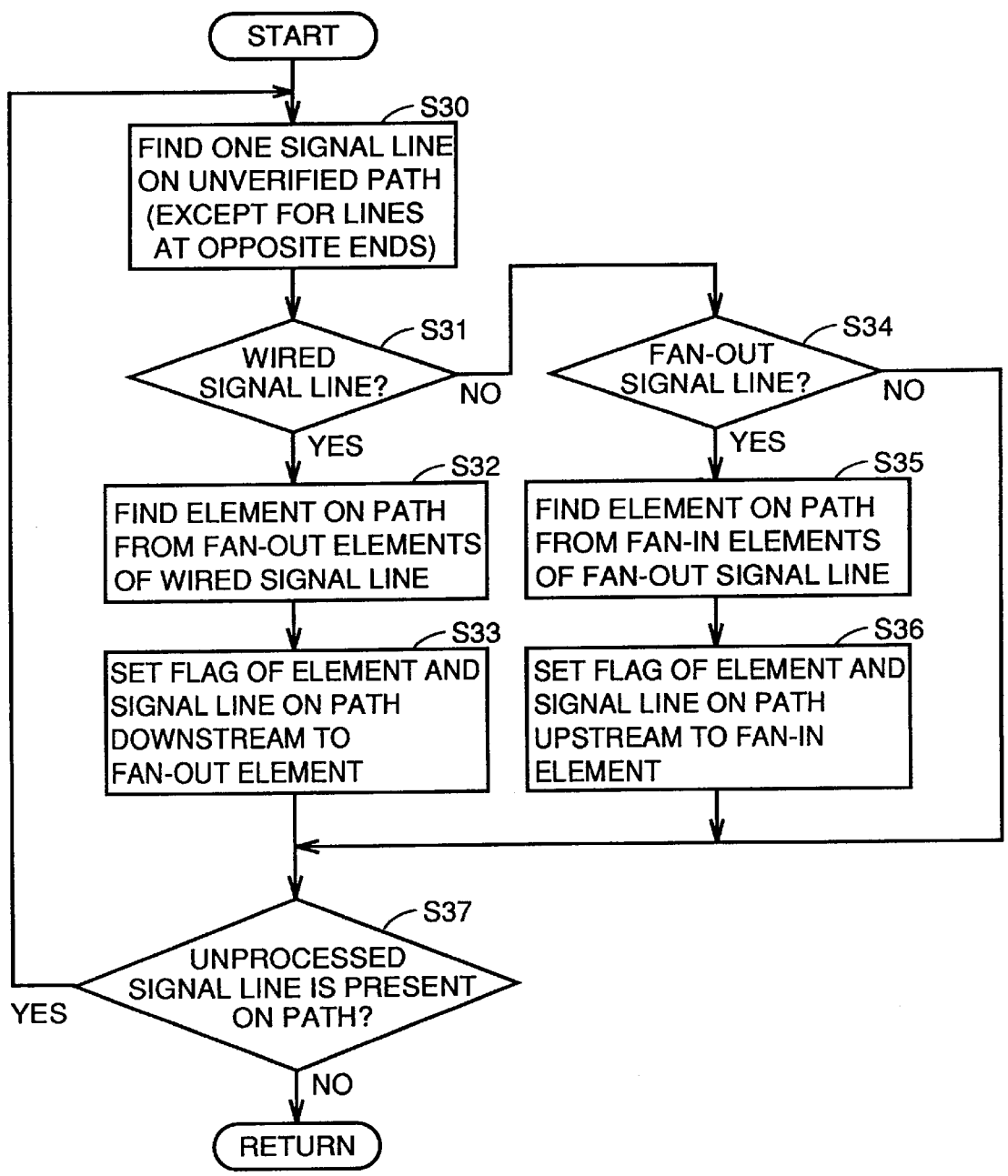
FIG. 8 is a flowchart showing processing of setting flag states of the element and the signal line in accordance with a type of a signal line.

If the element selected at S22 is not a multi-input element (NO at S23), it is determined whether this element is a multi-output element or not (S26). If it is a multi-output element (YES at S26), the signal line present on the unverified path is found from the input signal lines of the multi-output element (S27). Flags of the elements and signal lines on the path upstream from the input signal thus found are set (S28). If the element selected at S22 is neither a multi-input element nor a multi-output element (NO at S23, and NO at S26), it is determined whether an unprocessed element is present on the unverified path or not (S29). If the unprocessed element (YES at S29) is present, processing at and after S22 is repeated. If there is no unprocessed element (NO at S29), the processing at S12, which will be described later more in detail with reference to FIG. 8, is continued. The processing at S29 is also performed after completion of the processing at S25 and S28.

Figure 9:
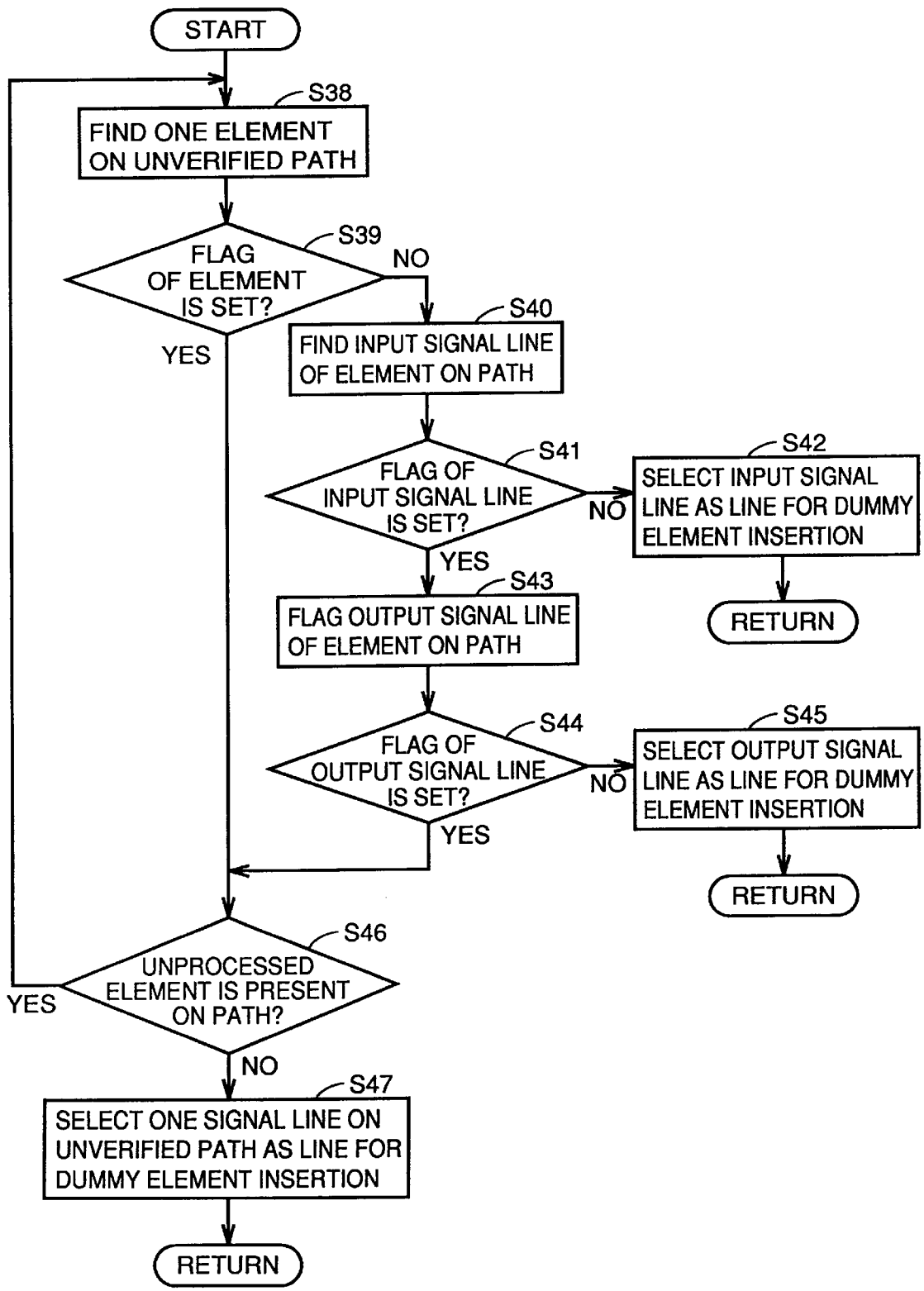
FIG. 9 is a flowchart showing processing of selecting a signal line for virtual insertion of a dummy element thereinto.

Referring to FIG. 8, the processing at S12 will now be described more in detail. One of the signal lines on the unverified path except for the signal lines at the opposite ends is selected (S30). It is determined whether the selected signal line is a wired signal line or not (S31). If the selected signal line is a wired signal line (YES at S31), one located on the unverified path is found from the fan-out elements of the wired signal lines (S32). Flags of the element and signal line which are present downstream to the fan-out element thus found are set (S33). If the signal line selected at S30 is not a wired signal line (NO at S31), it is determined whether this signal line is a fan-out signal or not (S34). If this signal line is a fan-out signal line (YES at S34), a fan-in element (buffer 46) present on the path is found from the fan-in elements of the fan-out signal line (signal line 44b, S35). Flags of the elements (buffer 46 and flip-flop 42) and signal line (signal line 44a) present upstream from the element thus found are set (S36). If the signal line selected at S30 is neither a wired signal line nor a fan-out signal line (NO at S31 and NO at S34), it is determined whether an unprocessed signal line is present on the unverified path or not (S37). If the unprocessed signal line is present, processing at and after S30 is repeated. If the unprocessed signal line is not present (NO at S37), processing at S13, which will be described later more in detail with reference to FIG. 9, is continued. The processing at S37 is also performed after completion of the processing at S33 and S36.

Referring to FIG. 9, processing at S13 will now be described more in detail. By the processing at and before S12, flags of flip-flops 42 and 43, buffer 46 and signal lines 44a and 44c are set, and flags of AND element 45 and signal line 44b are reset. One of the elements on the unverified path is selected (S38). It is determined whether the flag of the element thus selected is set or not (S39). If the flag of the element is set (YES at S39), it is determined whether an unprocessed element is present on the unverified path (S46). If the unprocessed element is present (YES at S46), the processing at and after S38 is repeated. If the unprocessed element is not present (NO at S46), arbitrary one is selected from the signal lines on the unverified path as the signal line into which a dummy element is to be virtually inserted (S47).

Figure 5B:
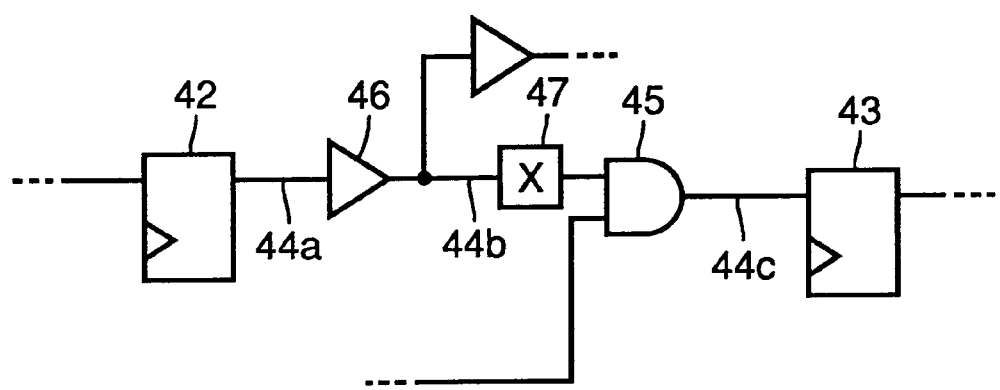

If it is determined by the processing at S39 the flag of the element is not set (NO at S39), the input signal line (signal 44b) of this element (AND element 45) is found (S40). It is determined whether the flag of the input signal line (signal line 44b) thus found is set or not (S41). If the flag is not set (NO at S41), this input signal line (signal line 44b) is determined as the signal line into which the dummy element is to be virtually inserted, and the processing at S13 is completed (S42). If the input signal line is provided at its middle with a diversion(s), as is done in signal line 44b, the dummy element is inserted between the diversion at the most downstream position and the element selected at S40. Thereafter, the processing at S5 shown in FIG. 4 is executed, and a dummy element 47 is virtually inserted into the above signal line (signal line 44b, see FIG. 5B).

If the flag of the input signal line of the element selected at S38 is set (YES at S41), the output signal line of the element selected at S38 is found (S43). It is determined whether the flag of the output signal line thus found is set or not (S44). If the flag is not set, this output signal line is determined as the signal line into which the dummy element is to be virtually inserted, and the processing at S13 is finished (S45). If the output signal line is provided at its middle with a diversion(s), the dummy element is inserted between the diversion at the most upstream position and the element selected at S43. Thereafter, the processing at S5 shown in FIG. 4 is executed, and the dummy element is virtually inserted into the above output signal line.

If the flag of the output signal line is set (YES at S44), the processing at and after S46 already described is executed.

As described above, the signal line which does not belong to any other path is found from the signal lines on the unverified path, and the dummy element is virtually inserted into the signal line thus found. Thereby, it is possible to minimize an influence which the output of the dummy element exerts on the other paths, and reduction in failure detecting rate can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test pattern producing method for a semiconductor device comprising:
    a step of receiving a result of timing verification of a semiconductor device and selecting an unverified path in said semiconductor device based on the result of said timing verification;
    a signal line select step of selecting a signal line on said unverified path;
    a dummy element inserting step of virtually inserting, into said selected signal line in series, a dummy element always outputting an inconstant value; and
    a step of producing a test pattern for said semiconductor device containing said dummy element virtually inserted into said selected signal line.

2. The test pattern producing method for the semiconductor device according to claim 1, wherein
    said signal line select step includes an isolated signal line select step of selecting from a plurality of signal lines on said unverified path a signal line not located upstream to a divided signal line and not located downstream from a coupled signal line.

3. The test pattern producing method for the semiconductor device according to claim 2, wherein said isolated signal line select step includes:
    a step of setting a first predetermined value at each of a plurality of flags that is related to respective elements and signal lines on said unverified path;
    a step of selecting an output signal line present on said unverified path from output signal lines of a multi-input element on said unverified path and setting a second predetermined value at each of said flags that is related to an element and signal line on said unverified path present downstream to said selected output signal line;
    a step of selecting an input signal line present on said unverified path from input signal lines of a multi-output element on said unverified path and setting said second predetermined value at each of said flags that is related to an element and signal line on said unverified path present upstream from said selected input signal line;
    a step of selecting a fan-out element present on said unverified path from fan-out elements connected to a wired signal line on said unverified path and setting said second predetermined value at said each of said flags that is related to an element and signal line on said unverified path present downstream to said selected fan-out element;
    a step of selecting a fan-in element present on said unverified path from fan-in elements connected to a fan-out signal line on said unverified path and setting said second predetermined value at said each of said flags that is related to an element and signal line on said unverified path present upstream from said selected fan-in element;
    a first select step of selecting one of said signal lines on said unverified path if all the values of flags related to elements on said unverified path are equal to said second predetermined value; and
    a second select step of selecting an element on said unverified path relating to one of said flags that is set to said first predetermined value, and selecting one signal line relating to said one of said flags that is set to said first predetermined value from said signal lines on said unverified path connected to said element selected in said second select step.

4. The test pattern producing method for the semiconductor device according to claim 3, wherein said dummy element inserting step includes:
    a step of virtually inserting said dummy element always outputting the inconstant value at an arbitrary position on said selected signal line if said selected signal line in series for virtual insertion of said dummy element is selected in said first select step, and
    a step of virtually inserting said dummy element always outputting the inconstant value at a position between said element selected in said second select step and one of a plurality of diversions on a signal line nearest to said element selected in said second select step in series.

5. The test pattern producing method for the semiconductor device according to claim 1, wherein said signal line select step includes a minimum influence signal line select step of selecting from signal lines on said unverified path a signal line exerting a minimum influence on a signal line on a path other than said unverified path during operation of said semiconductor device after the virtual insertion of said dummy element.

6. The test pattern producing method for the semiconductor device according to claim 5, wherein said minimum influence signal line select step includes:
    a step of setting a first predetermined value at each of a plurality of flags that is related to elements and signal lines on said unverified path;
    a step of selecting an output signal line present on said unverified path from output signal lines of a multi-input element on said unverified path and setting a second predetermined value at each of said flags that is related to an element and signal line on said unverified path present downstream to said selected output signal line;

a step of selecting an input signal line present on said unverified path from input signal lines of a multi-output element on said unverified path and setting said second predetermined value at each of said flags that is related to an element and signal line on said unverified path present upstream from said selected input signal line;

a step of selecting a fan-out element present on said unverified path from fan-out elements connected to a wired signal line on said unverified path and setting said second predetermined value at said each of said flags that is related to an element and signal line on said unverified path present downstream to said selected fan-out element;

a step of selecting a fan-in element present on said unverified path from fan-in elements connected to a fan-out signal line on said unverified path and setting said second predetermined value at said each of said flags that is related to an element and signal line on said unverified path present upstream from said selected fan-in element;

a first select step of selecting one of said signal lines on said unverified path if all the values of flags related to elements on said unverified path are equal to said second predetermined value; and a second select step of selecting an element on said unverified relating to one of said flags that is set to said first predetermined value, and selecting one signal line relating to said one of said flags that is set to said first predetermined value from said signal lines on said unverified path connected to said element selected in said second select step.

7. The test pattern producing method for the semiconductor device according to claim 6, wherein said dummy element inserting step includes:

a step of virtually inserting said dummy element always outputting the inconstant value at an arbitrary position on said selected signal line if said selected signal line in series for virtual insertion of said dummy element is selected in said first select step, and a step of virtually inserting said dummy element always outputting the inconstant value at a position between said element selected in said second select step and one of a plurality of diversions on a signal line nearest to said element selected in said second select step in series.

8. A computer-readable record medium bearing instructions, which, when executed cause a computer to produce a test pattern for a semiconductor device, said instructions comprising:

instructions for receiving a result of timing verification of the semiconductor device and selecting an unverified path in said semiconductor device based on the result of said timing verification;

signal line select instructions for selecting a signal line on said unverified path;

dummy element inserting instructions for virtually inserting, into said selected signal line in series, a dummy element always outputting an inconstant value; and instructions for producing the test pattern for said semiconductor device containing said dummy element virtually inserted into said selected signal line.

9. The computer-readable record medium according to claim 8, wherein said signal line select instructions includes isolated signal line select instructions for selecting from a plurality of signal lines on said unverified path a signal line not located upstream to a divided signal line and not located downstream from a coupled signal line.

10. The computer-readable record medium according to claim 9, wherein said isolated signal line select instructions include:

instructions for setting a first predetermined value at each of a plurality of flags that is related to respective elements and signal lines on said unverified path;

instructions for selecting an output signal line present on said unverified path from output signal lines of a multi-input element on said unverified path and setting a second predetermined value at each of said flags that is related to an element and signal line on said unverified path present downstream to said selected output signal line;

instructions for selecting an input signal line present on said unverified path from input signal lines of a multi-output element on said unverified path and setting said second predetermined value at each of said flags that is related to an element and signal line on said unverified path present upstream from said selected input signal line;

instructions for selecting a fan-out element present on said unverified path from fan-out elements connected to a wired signal line on said unverified path and setting said second predetermined value at said each of said flags that is related to an element and signal line on said unverified path present downstream to said selected fan-out element;

instructions for selecting a fan-in element present on said unverified path from fan-in elements connected to a fan-out signal line on said unverified path and setting said second predetermined value at said each of said flags that is related to an element and signal line on said unverified path present upstream from said selected fan-in element;

first select instructions for selecting one of said signal lines on said unverified path if all the values of flags related to elements on said unverified path are equal to said second predetermined value; and second select instructions for selecting an element on said unverified path relating to one of said flags that is set to said first predetermined value, and selecting one signal line relating to said one of said flags that is set to said first predetermined value from said signal lines on said unverified path connected to said element by said second select instructions.

11. The computer-readable record medium according to claim 10, wherein said dummy element inserting instructions include:

instructions for virtually inserting said dummy element always outputting the inconstant value at an arbitrary position on said selected signal line if said selected signal line in series for virtual insertion of said dummy element is selected by said first select instructions, and instructions for virtually inserting said dummy element always outputting the inconstant value at a position between said element selected in said second select step and one of a plurality of diversions on a signal line nearest to said element selected in by second select instructions in series.

12. The computer-readable record medium according to claim 8, wherein said signal line select instructions include minimum influence signal line select instructions for selecting from signal lines on said unverified path a signal line exerting a minimum influence on a signal line on a path other than said unverified path during operation of said semiconductor device after the virtual insertion of said dummy element.

13. The computer-readable record medium according to claim 12, wherein said minimum influence signal line select instructions include:

instructions for setting a first predetermined value at each of a plurality of flags that is related to elements and signal lines on said unverified path;

instructions for selecting an output signal line present on said unverified path from output signal lines of a multi-input element on said unverified path and setting a second predetermined value at each of said flags that is related to an element and signal line on said unverified path present downstream to said selected output signal line;

a step of selecting an input signal line present on said unverified path from input signal lines of a multi-output element on said unverified path and setting said second predetermined value at each of said flags that is related to an element and signal line on said unverified path present upstream from said selected input signal line;

a step of selecting a fan-out element present on said unverified path from fan-out elements connected to a wired signal line on said unverified path and setting said second predetermined value at said each of said flags that is related to an element and signal line on said unverified path present downstream to said selected fan-out element;

a step of selecting a fan-in element present on said unverified path from fan-in elements connected to a fan-out signal line on said unverified path and setting said second predetermined value at said each of said flags that is related to an element and signal line on said unverified path present upstream from said selected fan-in element;

first select instructions for selecting one of said signal lines on said unverified path if all the values of flags related to elements on said unverified path are equal to said second predetermined value; and second select instructions selecting element on said unverified path relating to one of said flags that is set to said first predetermined value, and selecting one signal line relating to said one of said flags that is set to said first predetermined value from said signal lines on said unverified path connected to said element by said second select instructions.

14. The computer-readable record medium according to claim 13, wherein said dummy element inserting instructions include:

instructions for virtually inserting said dummy element always outputting the inconstant value at an arbitrary position on said selected signal line if said selected signal line in series for virtual insertion of said dummy element is selected by said first select instructions, and instructions for virtually inserting said dummy element always outputting the inconstant value at a position between said element selected by said second select instructions and the one of a plurality of diversions on a signal line nearest to said element selected by said second select instructions in series.

* * * * *